United States Patent
Kim et al.

(10) Patent No.: US 10,870,915 B2
(45) Date of Patent: Dec. 22, 2020

(54) DEPOSITION APPARATUS, METHOD OF FORMING THIN FILM USING THE SAME, AND METHOD OF MANUFACTURING ORGANIC LIGHT EMITTING DISPLAY APPARATUS

(71) Applicant: SAMSUNG DISPLAY CO., LTD., Yongin-si (KR)

(72) Inventors: Sun-Ho Kim, Yongin-si (KR); Myung-Soo Huh, Yongin-si (KR); Jeong-Ho Yi, Yongin-si (KR); Cheol-Rae Jo, Yongin-si (KR); Hyun-Woo Joo, Yongin-si (KR); Yong-Suk Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 231 days.

(21) Appl. No.: 16/024,626

(22) Filed: Jun. 29, 2018

(65) Prior Publication Data
US 2018/0305809 A1 Oct. 25, 2018

Related U.S. Application Data

(62) Division of application No. 14/012,916, filed on Aug. 28, 2013, now Pat. No. 10,081,862.

(30) Foreign Application Priority Data

Apr. 4, 2013 (KR) .................. 10-2013-0036979

(51) Int. Cl.
*C23C 14/56* (2006.01)
*H01L 21/56* (2006.01)
*C23C 14/24* (2006.01)
*C23C 16/44* (2006.01)
*H01L 51/00* (2006.01)

(52) U.S. Cl.
CPC ............ *C23C 14/564* (2013.01); *C23C 14/24* (2013.01); *C23C 16/4412* (2013.01); *H01L 21/56* (2013.01); *H01L 51/0008* (2013.01)

(58) Field of Classification Search
CPC .................................................. H01L 51/0008
See application file for complete search history.

(56) References Cited

U.S. PATENT DOCUMENTS

| 4,210,814 A | 7/1980 | Clifford |
| 4,394,236 A | 7/1983 | Robinson |

(Continued)

FOREIGN PATENT DOCUMENTS

| CN | 1251294 C | 4/2006 |
| CN | 101960041 A | 1/2011 |

(Continued)

*Primary Examiner* — Austin Murata
(74) *Attorney, Agent, or Firm* — Lewis Roca Rothgerber Christie LLP

(57) ABSTRACT

A deposition apparatus configured to perform a deposition process on a substrate, the deposition apparatus including a chamber having an exhaust opening in a surface, a deposition source in the chamber configured to eject one or more deposition materials toward the substrate, a cooling plate corresponding to an inner surface of the chamber, at which the exhaust opening is formed, a refrigerator contacting the cooling plate, and a pump coupled to the exhaust opening.

6 Claims, 6 Drawing Sheets

(56) References Cited

U.S. PATENT DOCUMENTS

| | | |
|---|---|---|
| 4,624,214 A | 11/1986 | Suzuki et al. |
| 5,234,862 A | 8/1993 | Aketagawa et al. |
| 5,253,266 A | 10/1993 | Knodle, III et al. |
| 5,340,460 A | 8/1994 | Kobayashi et al. |
| 6,053,981 A * | 4/2000 | Salokatve .............. C23C 14/243 118/726 |
| 6,101,316 A | 8/2000 | Nagashima et al. |
| 6,302,966 B1 | 10/2001 | Bailey, III et al. |
| 2002/0007795 A1 | 1/2002 | Bailey, III et al. |
| 2004/0056244 A1 | 3/2004 | Marcus et al. |
| 2005/0186340 A1 | 8/2005 | Long et al. |
| 2005/0236270 A1 | 10/2005 | Cheng et al. |
| 2007/0119849 A1 | 5/2007 | Jeong et al. |
| 2008/0305360 A1 | 12/2008 | Han et al. |
| 2009/0133622 A1 * | 5/2009 | Huang .................... B05D 1/62 118/663 |
| 2009/0137099 A1 * | 5/2009 | Schonherr ............... C30B 23/02 438/478 |
| 2011/0042208 A1 | 2/2011 | Negishi et al. |
| 2012/0097102 A1 | 4/2012 | Villette et al. |
| 2013/0299804 A1 * | 11/2013 | Ogata ................... H01L 27/322 257/40 |

FOREIGN PATENT DOCUMENTS

| | | |
|---|---|---|
| JP | 6-220619 A | 8/1994 |
| JP | 2009-124156 A | 6/2009 |
| KR | 10-2000-0000782 A | 1/2000 |
| KR | 10-2008-0107220 A | 12/2008 |
| KR | 10-2009-0015378 A | 2/2009 |
| KR | 10-2011-0039027 A | 4/2011 |
| KR | 10-2012-0030795 A | 3/2012 |
| KR | 10-2012-0039549 A | 4/2012 |
| TW | 200923145 A | 6/2009 |
| WO | WO 2011/043566 A2 | 4/2011 |
| WO | WO 2012/039523 A1 | 3/2012 |

\* cited by examiner

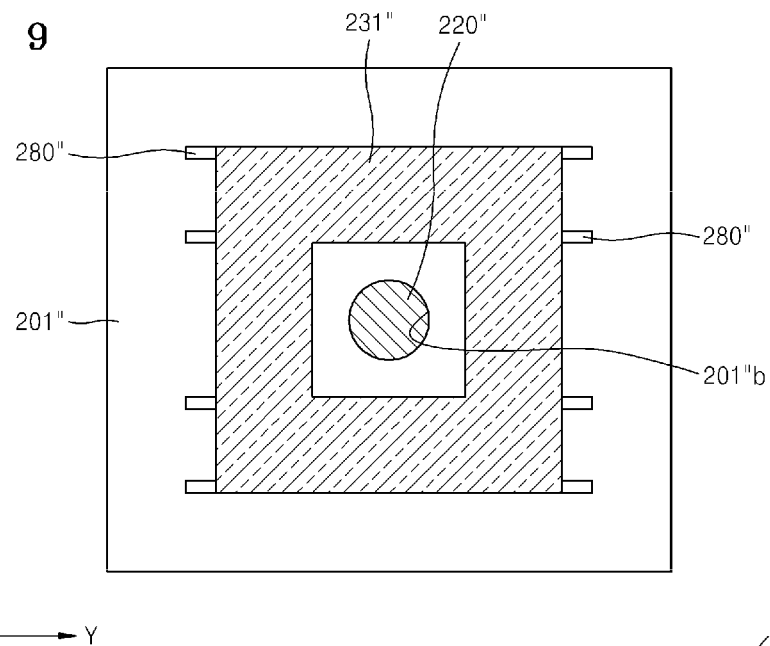
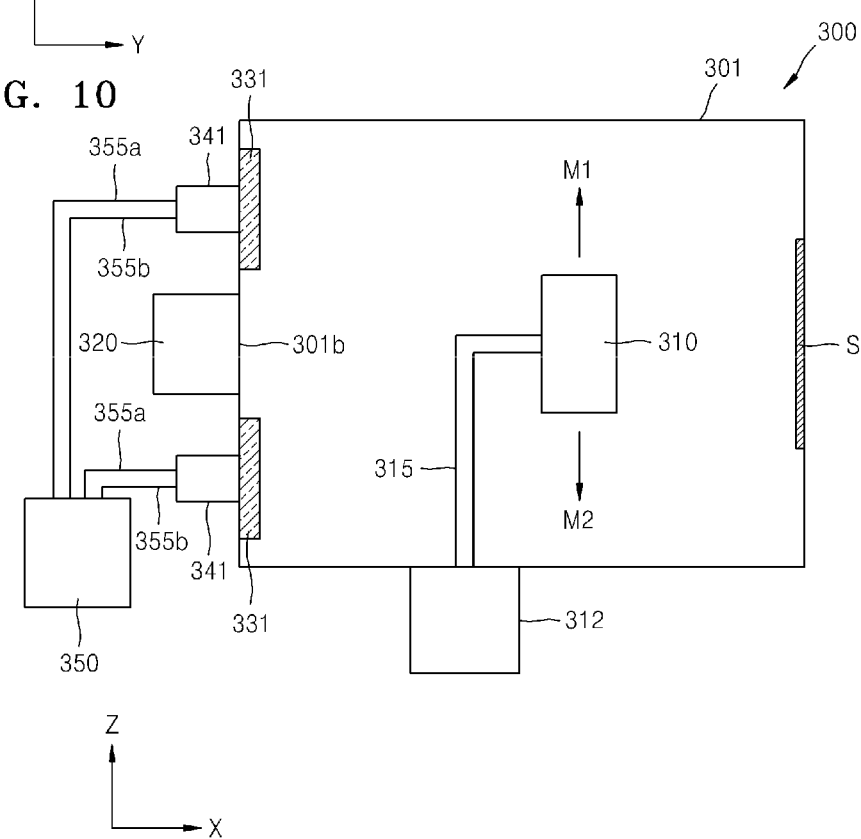

DEPOSITION APPARATUS, METHOD OF FORMING THIN FILM USING THE SAME, AND METHOD OF MANUFACTURING ORGANIC LIGHT EMITTING DISPLAY APPARATUS

CROSS-REFERENCE TO RELATED APPLICATION

This application is a divisional of U.S. patent application Ser. No. 14/012,916, filed Aug. 28, 2013, which claims priority to and the benefit of Korean Patent Application No. 10-2013-0036979, filed Apr. 4, 2013, the entire content of both of which is incorporated herein by reference.

BACKGROUND

1. Field

The following description relates to a deposition apparatus, a thin film forming method using the same, and a method of manufacturing an organic light emitting display apparatus.

2. Description of the Related Art

Semiconductor devices, display apparatuses, and other electronic devices include a plurality of thin films. One method of forming the plurality of thin films is through a deposition process.

Among display apparatuses, organic light emitting displays are considered as the next generation display apparatuses owing to characteristics such as wide viewing angle, high contrast, and fast response speed.

An organic light emitting display apparatus includes a first electrode and a second electrode facing each other, an intermediate layer including an organic emission layer between the first and second electrodes, and one or more various suitable thin films, which may be formed through a deposition process. Further, an encapsulation layer is formed on a second electrode in a display apparatus such as an organic light emitting display apparatus, and the encapsulation layer may include an organic layer or an inorganic layer.

However, it is not easy to form such an encapsulation layer. For example, it is difficult to effectively control deposition processes for forming the encapsulation layer, and thus, there is a limitation in forming deposition films having desired characteristics. In addition, there is a limitation in improving characteristics of the encapsulation layer.

SUMMARY

Aspects of embodiments of the present invention are directed toward a deposition apparatus capable of effectively performing deposition processes and improving characteristics of deposition films, a method of forming a thin film using the deposition apparatus, and a method of manufacturing an organic light emitting display apparatus.

According to an aspect of embodiments of the present invention, there is provided a deposition apparatus configured to perform a deposition process on a substrate, the deposition apparatus including: a chamber having an exhaust opening in a surface; a deposition source in the chamber configured to eject one or more deposition materials toward the substrate; a cooling plate corresponding to an inner surface of the chamber, at which the exhaust opening is formed; a refrigerator contacting the cooling plate; and a pump coupled to the exhaust opening.

The chamber may have a through hole corresponding to the cooling plate, and the refrigerator passes through the through hole from an outside of the chamber so that an end portion of the refrigerator is in the chamber and corresponding to a surface of the cooling plate.

The deposition apparatus may further include a gasket between the refrigerator and the cooling plate.

The cooling plate and the inner surface of the chamber may be separated from each other.

The deposition apparatus may further include a support rod between the cooling plate and the inner surface of the chamber.

The support rod may separate the cooling plate from the inner surface of the chamber.

The support rod may be longer than the cooling plate.

The support rod may be elongated to extend beyond both opposite end portions of the cooling plate in a lengthwise direction.

The deposition apparatus may further include a heating member between the cooling plate and the inner surface of the chamber, the heating member being separated from the refrigerator.

The heating member may contact the cooling plate.

The cooling plate may include cooling plates that are positioned at opposite sides of the exhaust opening.

The cooling plate may include cooling plates that surround the exhaust opening.

The cooling plates may be integrally formed with each other.

The deposition apparatus may further include a lattice member configured to contact a surface of the cooling plate opposite to a surface facing the refrigerator.

The deposition source and the exhaust opening may be positioned to correspond to a same surface of the chamber.

The deposition source may be at a lower surface of the chamber, and the exhaust opening may be at a side surface of the chamber.

The substrate may be on a first side surface of the chamber, and the exhaust opening may be at a second side surface of the chamber facing the first side surface of the chamber.

The substrate or the deposition source may be capable of moving during a deposition process.

The deposition apparatus may further include a compressor coupled to the refrigerator and be configured to process a cooling material in the refrigerator.

The deposition material may include an organic monomer.

The deposition apparatus may further include an evaporation unit at an outside of the chamber and coupled to the deposition source.

The evaporation unit may be configured to receive a deposition material of a liquid phase from a liquid phase material supply device, to vaporize the liquid phase deposition material, and to supply the vaporized deposition material to the deposition source.

According to an aspect of embodiments of the present invention, there is provided a method of forming a thin film by performing a deposition process on a substrate using a deposition apparatus, the method including: carrying the substrate into a chamber; ejecting one or more deposition materials toward the substrate using a deposition source in the chamber; and capturing the deposition materials remaining in the chamber using a cooling plate coupled to a refrigerator and corresponding to an inner surface of the chamber, at which an exhaust opening is formed.

The deposition process may be performed while moving the substrate or the deposition source.

A cooling material in the refrigerator may be processed using a compressor.

According to another aspect of embodiments of the present invention, there is provided a method of manufacturing an organic light emitting display apparatus using a deposition apparatus, the method including forming at least one thin film in the organic light emitting display apparatus, wherein the forming of the at least one thin film includes: carrying a substrate into a chamber; ejecting one or more deposition materials toward the substrate using a deposition source in the chamber; and capturing the deposition materials remaining in the chamber using a cooling plate coupled to a refrigerator and corresponding to an inner surface of the chamber, at which an exhaust opening is formed.

The organic light emitting display apparatus includes a first electrode, an intermediate layer including an organic emission layer, a second electrode, and an encapsulation layer on the substrate, the encapsulation layer including at least one thin film.

The encapsulation layer may include an organic layer and an inorganic layer the organic layer including the at least one thin film.

BRIEF DESCRIPTION OF THE DRAWINGS

The above and other features and aspects of the present invention will become more apparent by describing in detail example embodiments thereof with reference to the attached drawings in which:

FIGS. 8 and 9 are diagrams showing modified examples of the deposition apparatus of FIG. 6, according to some embodiments of the present invention;

FIG. 10 is a schematic diagram showing a deposition apparatus, according to another example embodiment of the present invention;

DETAILED DESCRIPTION

Hereinafter, embodiments of the present invention will be described in detail with reference to accompanying drawings.

Figure 1:
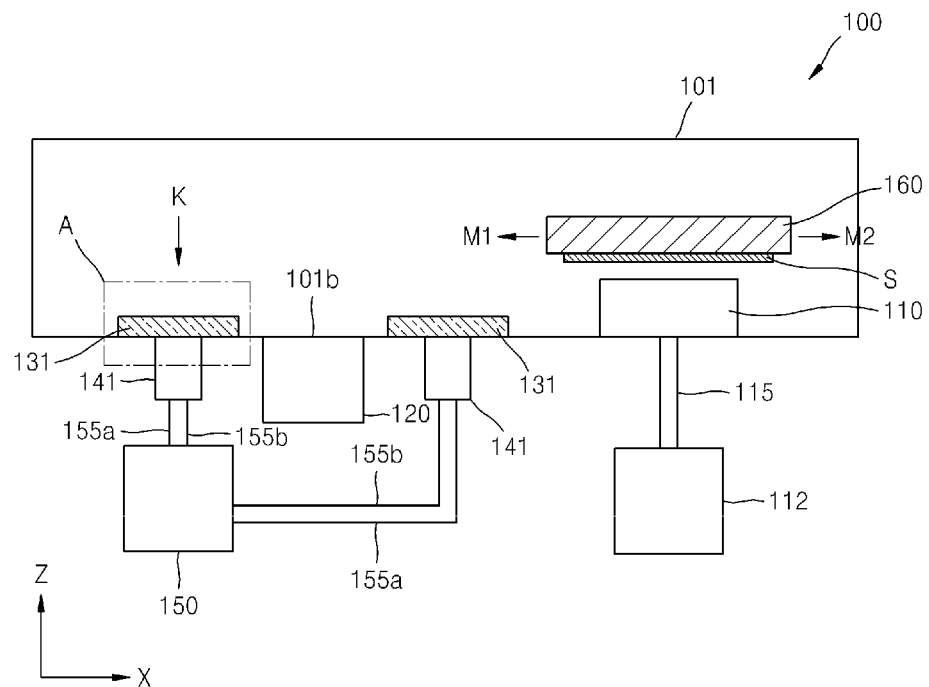
FIG. 1 is a schematic diagram of a deposition apparatus, according to an example embodiment of the present invention.
Figure 2:
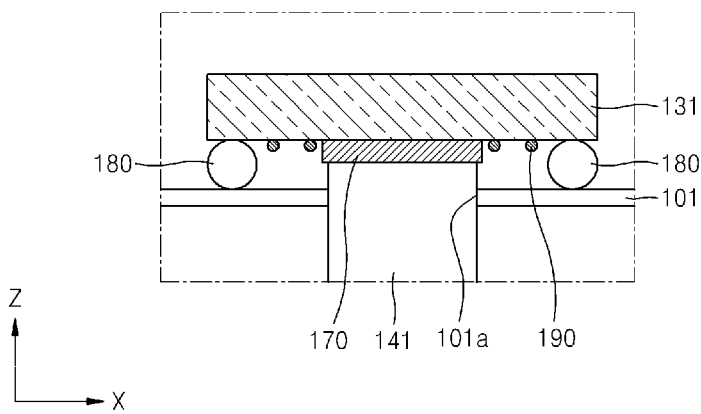
FIG. 2 is an enlarged view of the portion A in FIG. 1, according to an example embodiment of the present invention.
Figure 3:
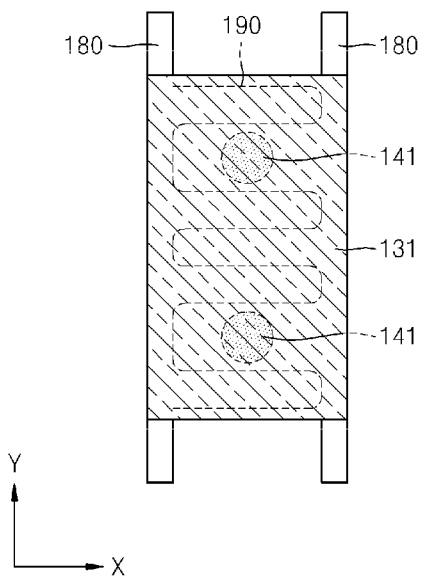
FIG. 3 is a plan view of the deposition apparatus seen from a direction of K in FIG. 1 with some of the hidden components shown in phantom lines, according to an example embodiment of the present invention.

FIG. 1 is a schematic diagram showing a deposition apparatus 100, according to an example embodiment of the present invention, FIG. 2 is an enlarged view of a portion A in FIG. 1, according to an embodiment of the present invention, and FIG. 3 is a diagram of the deposition apparatus 100 seen from a direction of K in FIG. 1, according to an embodiment of the present invention.

Referring to FIGS. 1 through 3, the deposition apparatus 100 includes a chamber 101, a deposition source 110, a pump 120, a cooling plate 131, a refrigerator 141, and a compressor 150.

The chamber 101 is formed to maintain atmosphere of a deposition space in which deposition processes are performed. The chamber 101 includes one or more entries for carrying substrates S in and out of the chamber 101. Also, the chamber 101 has an exhaust hole (e.g., an exhaust opening) 101b for controlling a pressure environment during the deposition processes. In addition, the chamber 101 includes a through hole 101a that corresponds to the refrigerator 141 that will be described later.

The deposition source 110 is located (e.g., positioned or disposed) in the chamber 101. The deposition source 110 may be fixed at a side of the chamber 101, for example, a lower surface of the chamber 101. The deposition source 110 may include one or more nozzles for ejecting a deposition material toward the substrates S. The deposition source 110 may further include a hardening unit for hardening a deposition layer after forming the deposition layer on the substrate S using the deposition material.

An evaporation unit 112 may be coupled to (or connected to) the deposition source 110 via a connection member 115. The evaporation unit 112 supplies the deposition material that is evaporated from a liquid phase to the deposition source 110. A liquid material supply device is coupled to the evaporation unit 112 to supply the liquid material to the evaporation unit 112, and the evaporation unit 112 evaporates the liquid material, which may include an organic monomer, and supplies gas phase material to the deposition source 110. For example, the deposition source 110 supplies the deposition material containing organic monomer to the substrates S to form the deposition layer including an organic material.

The substrate S that is a deposition target on which the deposition process is to be performed is located on an upper portion of the deposition source 110. The substrate S may be fixed on a stage 160, for example, using a clamp.

In one embodiment, the stage 160 may selectively move. For example, as shown in FIG. 1, the stage 160 may reciprocate between M1 and M2 directions. Thus, the deposition process may be performed while the substrate S moves relative to the deposition source 110. A driving unit may be additionally located or a driving member may be formed in the stage 160 to drive the stage 160. However, embodiments of the present invention are not limited thereto, and the stage 160 may be fixed.

The pump 120 is located on an outer portion of the chamber 101. The pump 120 is coupled to the exhaust hole (e.g., an exhaust opening) 101b of the chamber 101 to control the pressure and cleanliness (i.e., the quality of having low levels of environmental pollutants and contaminants) of the environment in the chamber 101 during the deposition process. The pump 120 may be any one of various suitable kinds of pumps, for example, a turbo pump or a cryo pump.

Two cooling plates 131 are located around the exhaust hole 101b in the chamber 101. In one embodiment, the two cooling plates 131 are located on opposite sides of the exhaust hole 101b, with the exhaust hole 101b interposed therebetween. The cooling plates 131 may be formed of a metal material having excellent thermal conductivity, for example, copper, and in particular, oxygen-free copper. The cooling plates 131 capture the deposition material remaining in the chamber 101 after the deposition process to maintain the cleanliness of the chamber 101. For example, the cooling plates 131 may prevent the remaining deposition material from being sucked by the pump 120 via the exhaust hole 101b and from damaging the pump 120.

Further, when the deposition process is performed, the deposition material existing in the chamber 101, not being deposited on the substrate S, or moving toward the exhaust hole 101b due to the operation of the pump 120, may be captured by the cooling plates 131 to prevent the damage of the pump 120.

Two refrigerators 141 may be coupled to one cooling plate 131. In one embodiment, the refrigerators 141 are directly coupled to the cooling plate 131 without a connection member such as a hose or a pipe. For example, a region (e.g., a preset or predetermined region) on a lower surface of the cooling plate 131 contacts the refrigerators 141. As such, a temperature of the cooling plate 131 may be maintained at a low (e.g., an extremely low) temperature.

A cooling material such as helium is contained in the refrigerators 141, and members for freezing, for example, a heat exchanger, a condenser, and other components may be included in each of the refrigerators 141.

The refrigerators 141 may be coupled to a compressor 150, and the cooling material (e.g., helium) is transferred to the compressor 150 via a discharge pipe 155a to be processed (e.g., successively processed), and then, may be transferred to the refrigerators 141 again via an introduction pipe 155b.

As shown in FIG. 3, the cooling plates 131 may be formed as rectangles (e.g., may have a rectangular shape) extending along a direction.

The refrigerators 141 extend from the outside of the chamber 101 into the chamber 101. For example, the refrigerators 141 pass through the chamber 101 via the through hole 101a of the chamber 101 so that an end of the refrigerator 141 contacts the lower surface of the cooling plate 131 located in the chamber 101.

In one embodiment, a gasket 170 may be located between the refrigerator 141 and each of the cooling plates 131 so as to stably maintain a contact status between the refrigerator 141 and the cooling plates 131. The gasket 170 may include aluminium or indium having excellent thermal conductivity. The gasket 170 may be formed as a thin disk, a surface of which is adhered to the refrigerator 141 and the other surface of which is adhered to the cooling plate 131. As such, cooling material may be transferred from the refrigerator 141 to the cooling plates 131.

Support rods 180 are located between the cooling plate 131 and the chamber 101. Thus, the cooling plate 131 is separated from the chamber 101. The refrigerator 141 extends into the chamber 101 to a height (e.g., a predetermined height) to contact the cooling plate 131.

Two support rods 180 are located between the cooling plate 131 and an inner surface of the chamber 101. The support rods 180 are separated from the refrigerators 141. The support rods 180 are elongated to correspond to a length of the cooling plate 131 along a direction (e.g., the Y direction shown in FIG. 3), and in particular, are longer than at least a length of the cooling plate 131 along the said direction so as to reach regions (e.g., predetermined regions) of the chamber 101 beyond opposite ends of the cooling plate 131.

The cooling plates 131 may be attached to/detached from the inside of the chamber 101 using the support rods 180. For example, there is no need to contact the cooling plate 131 to the inner surface of the chamber 101 in order to fix the cooling plates 131. Because the support rods 180 are longer than the cooling plates 131, the cooling plates 131 may easily be located on the support rods 180.

Also, because a part (e.g., a predetermined part) of the refrigerator 141 is located in the chamber 101 so as to contact the cooling plate 131 via the support rods 180, the contacting status between the refrigerator 141 and the cooling plate 131 may be stably maintained and the refrigerator 141 does not vibrate in the through hole 101a.

A heating member 190 is located to correspond to the lower surface of the cooling plate 131. For example, the heating member 190 is located in a separation space between the cooling plate 131 and the chamber 101 due to the support rods 180. In one embodiment, the heating member 190 contacts the lower surface of the cooling plate 131. The heating member 190 may be formed as a coil.

As described above, the cooling plates 131 capture the deposition material remaining in the chamber 101, and the captured deposition material is attached to the cooling plate 131 in a solid phase. After performing the deposition process, the deposition material attached to the cooling plates 131 may be removed using the heating member 190.

As shown in FIG. 3, the heating member 190 is bent in several places (each bend may be in a U-shape) and may span the entire surface of the cooling plate 131 and be separated from the refrigerator 141. Although not shown in FIG. 3, a power source is coupled to the heating member 190. The heating member 190 does not operate during the deposition process so as not to degrade the property of the cooling plate 131.

Operations and effects of the deposition apparatus 100, according to the present embodiment, will be described below. The deposition apparatus 100 includes the deposition source 110 for forming the deposition layer on the substrate S. In one embodiment, the deposition source 110 may supply the deposition material containing the organic monomer to the substrate S as a gas phase.

The vaporized deposition material reaches the substrate S and forms a desired deposition layer. In one embodiment, the deposition material remaining in the chamber 101 after forming the deposition layer, or the deposition material floating in the chamber 101 without involving in the deposition process, after being ejected from the deposition source 110, may affect subsequent deposition processes, thereby degrading characteristics of (or contaminating) subsequent deposition layers. When such deposition material is induced into the pump 120 through the exhaust hole 101b, characteristics of the pump 120 may be degraded, the deposition process environment in the chamber 101 may be degraded (e.g., polluted), and/or the pump 120 may be damaged.

In the present embodiment, the cooling plates 131 are located in the chamber 101 so as to capture the remaining deposition material in the chamber 101 and to maintain cleanliness (e.g., reduce contaminants) in the chamber 101, and thus, the characteristics of the pump 120 may be maintained and characteristics of the deposition layer may be improved. In one embodiment, the cooling plates 131 are located on opposite sides of the exhaust hole 101*b* that is coupled to the pump 120, and thus, the remaining deposition material may be effectively guided toward the cooling plates 131 and a capturing property may be improved.

As a result of the operation of the pump 120 connected to the exhaust hole 101*b*, the small amount of deposition material remaining in the chamber 101 without being deposited on the substrate S may move toward the exhaust hole 101*b* and its peripheral area, and accordingly, the cooling plates 131 located adjacent to the exhaust hole 101*b* may capture the deposition material.

Further, the refrigerators 141 are directly coupled to the lower surfaces of the cooling plates 131 so as to lower the temperature of the cooling plates 131 effectively, thereby increasing the capturing effect. Additionally, the heating member 190 is located on a region of the lower surface of the cooling plates 131, regardless of the deposition process, so as to remove the deposition material captured by the cooling plates 131 after finishing the deposition process.

In an embodiment in which the cooling plates 131 are located in the chamber 101, the cooling plates 131 are located on the support rods 180 so as to be separated from the inner wall of the chamber 101, and thus, the cooling plates 131 may be located on the desired location in the chamber 101 and may be separated therefrom.

Figure 4:
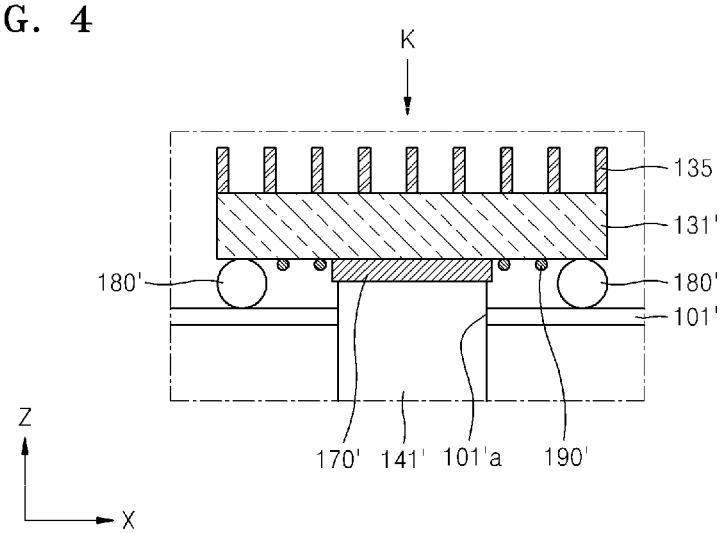
FIG. 4 is a schematic diagram showing a modified example of the deposition apparatus of FIG. 1, according to an example embodiment of the present invention.
Figure 5:
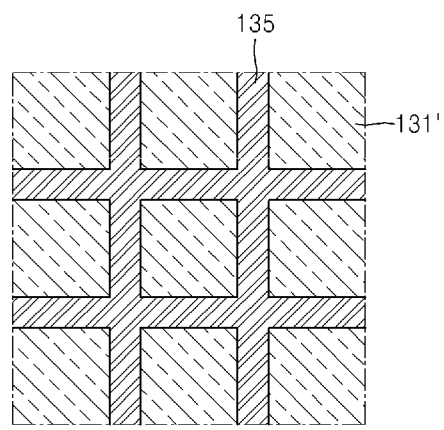
FIG. 5 is a diagram showing the deposition apparatus of FIG. 4 seen from a direction of K, according to an example embodiment of the present invention.

FIG. 4 is a diagram showing a modified example of the deposition apparatus 100 shown in FIG. 1, according to an embodiment of the present invention, and FIG. 5 is a diagram of the deposition apparatus of FIG. 4 seen from a direction K, according to an example embodiment of the present invention.

Referring to FIGS. 4 and 5, the deposition apparatus includes a chamber 101', a deposition source, a pump, cooling plates 131', a refrigerator 141', and a compressor. The deposition apparatus shown in FIGS. 4 and 5 is different from that of the previous embodiment in view of additionally including a lattice member 135.

The lattice member 135 is located to contact upper surfaces of the cooling plates 131', and includes a portion extending in a first direction and a portion extending in a second direction perpendicular to the first direction. The lattice member 135 may be formed of a metal material having excellent thermal conductivity. When using the lattice member 135 with the cooling plates 131', the capturing property of the deposition material remaining within the chamber 101' may be improved.

Other components are the same as those of the previous embodiment, and their detailed descriptions will not be repeated.

Figure 6:
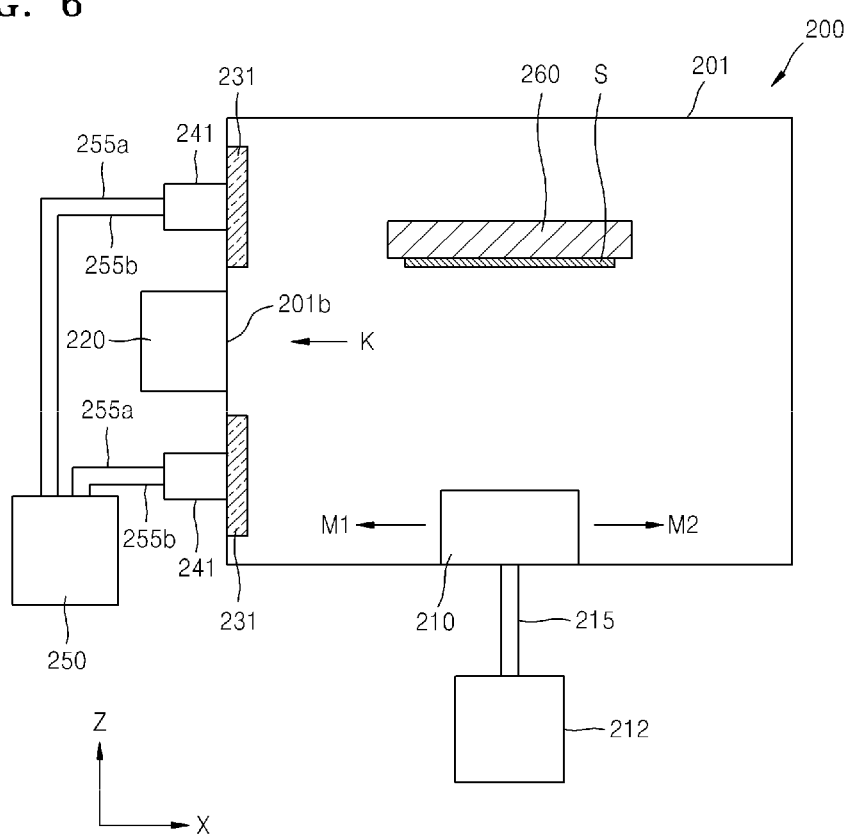
FIG. 6 is a schematic diagram of a deposition apparatus, according to another example embodiment of the present invention.
Figure 7:
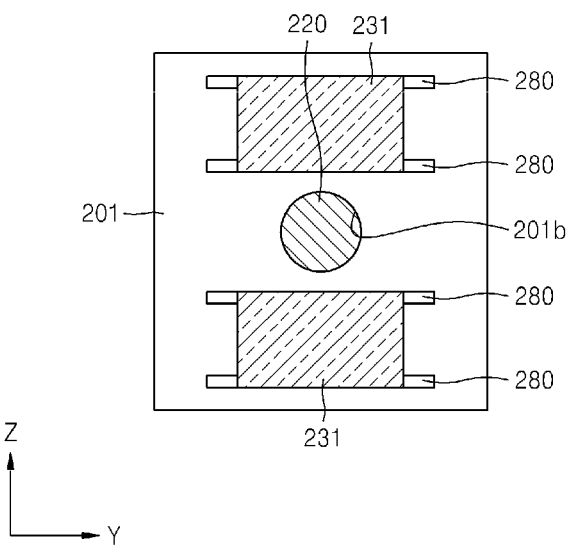
FIG. 7 is a diagram showing the deposition apparatus of FIG. 6 seen from a direction of K, according to an example embodiment of the present invention.

FIG. 6 is a schematic diagram of a deposition apparatus 200, according to another embodiment of the present invention, and FIG. 7 is a diagram of the deposition apparatus of FIG. 6 seen from a direction K, according to an example embodiment of the present invention.

Referring to FIGS. 6 and 7, the deposition apparatus 200 includes a chamber 201, a deposition source 210, a pump 220, cooling plates 231, refrigerators 241, and a compressor 250.

The chamber 201 is formed to properly maintain the environment of a deposition space in which deposition processes are performed. The chamber 201 includes one or more entries for carrying in and carrying out a substrate S. Additionally, the chamber 201 includes an exhaust hole (e.g., an exhaust opening) 201*b* at a side surface thereof so as to control a pressure during the deposition processes. Further, the chamber 201 includes a through hole (e.g., a through opening) that corresponds to the refrigerators 241 that will be described later.

The deposition source 210 is located in the chamber 201. The deposition source 210 is located at a side of the chamber 201, for example, a lower surface of the chamber 201, and the deposition source 210 may be capable of moving in one or more directions. For example, as shown in FIG. 6, the deposition source 210 may reciprocate between a direction M1 and an opposite direction M2.

The deposition source 210 may include a nozzle for supplying a deposition material toward the substrate S. In addition, the deposition source 210 may include a hardening portion for hardening a deposition layer after the deposition layer is formed on the substrate S by selectively using the deposition material.

An evaporation unit 212 may be coupled to the deposition source 210 via a connection member 215. Additionally, a liquid phase material supply apparatus is coupled to the evaporation unit 212 to supply the deposition material of a liquid phase to the evaporation unit 212, and the evaporation unit 212 vaporizes the deposition material and supplies the deposition material to the deposition source 210.

The substrate S that is a deposition target on which the deposition processes will be performed is located on an upper portion of the deposition source 210. The substrate S may be fixed on a stage 260. To do this, the substrate S may be fixed on the stage 260 using a member such as a clamp.

The pump 220 is located out of the chamber 201. The pump 220 is coupled to the exhaust hole 201*b* of the chamber 201 to control pressure environment of the deposition process and cleanliness of the chamber 201. The exhaust hole 201*b* is located at a side surface of the chamber 201. For example, the exhaust hole 201*b* is located at a surface of the chamber 201, which is adjacent to a surface on which the deposition source 210 is located. For example, the deposition source 210 may be located on the lower surface of the chamber 201, and the exhaust hole 201*b* may be located in the side surface of the chamber 201.

Two cooling plates 231 are located around the exhaust hole 201*b* in the chamber 201. In one embodiment, the two cooling plates 231 correspond to (e.g., are mounted at) a side surface of the chamber 201, and may be positioned at opposite sides of the exhaust hole 201*b*.

Two refrigerators 241 are coupled respectively to the cooling plates 231. In an embodiment, the refrigerators 241 are directly coupled to the cooling plates 231 without using a connection member such as a hose or a pipe. For example, an area (e.g., predetermined area) of a lower surface (e.g., the surface facing the wall of the chamber 201) of each cooling plate 231 contacts the refrigerator 241.

A cooling material such as helium is contained in the refrigerators 241, and members for freezing, such as a heat exchanger, a condenser, and other components may be included in each of the refrigerators 241.

The refrigerators 241 may be coupled to the compressor 250, and the cooling material (e.g., helium) is transferred to the compressor 250 via a discharge pipe 255*a* to be processed, and then, may be transferred to the refrigerators 241 again via an introduction pipe 255*b*.

As shown in FIG. 7, each of the cooling plates 231 may be formed as a rectangle (e.g., have a rectangular shape) extending in a direction.

Each of the refrigerators 241 extends from an outside of the chamber 201 into the chamber 201. For example, the refrigerator 241 passes through the chamber 201 via a through hole (e.g., a through opening) of the chamber 201 so that an end of the refrigerator 241 contacts the lower surface of the cooling plate 231 that is located in the chamber 201. Although not shown in FIG. 7, a gasket may be located between the refrigerator 241 and the cooling plate 231.

Support rods 280 are located between each of the cooling plates 231 and the chamber 201. As such, the cooling plates 231 are separated from the chamber 201. The refrigerators 241 extend into the chamber 201 to a height (e.g., predetermined height) so as to contact the cooling plates 231.

Two support rods 280 are located between each of the cooling plates 231 and an inner side surface of the chamber 201 so as to support the cooling plate 231. The support rods 280 are separated from the refrigerators 241. The support rods 280 are elongated to correspond to a width of the cooling plate 231 in a direction, and are formed to be longer than the width of the cooling plate 231 in the length direction so as to exceed the cooling plate 231 to a region (e.g., predetermined region) of the chamber 201 as shown in FIG. 7.

The cooling plates 231 may be conveniently located in/separated from the inside of the chamber 201 using the support rods 280. Thus, there is no need to make the cooling plates 231 contact the side surface of the chamber 201 to fix the cooling plates 231. Because the support rods 280 are longer than the cooling plates 231, the cooling plates 231 may be located on the support rods 280.

A heating member may be located to correspond to the lower surface of the cooling plate 231.

The cooling plates 231, the refrigerators 241, the support rods 280, the heating member, and the gasket are similar to those of the previous embodiment, and thus, detailed descriptions thereof are not provided here.

Operations and effects of the deposition apparatus 200, according to the present embodiment, will be described. The deposition apparatus 200 includes a deposition source 210 for forming a deposition layer on the substrate S. In one embodiment, the deposition source 210 may supply the deposition material containing an organic monomer to the substrate S in a gas state (or in gas phase).

The deposition material in gas phase reaches the substrate S to form a desired deposition layer. Here, the deposition source 210 is located to correspond to the lower surface of the chamber 201, and the deposition process may be performed while moving the deposition source 210 with respect to the substrate S. In addition, the exhaust hole 201b may be formed in the side surface of the chamber 201 to control the movement of the deposition source 210.

The deposition material remaining in the chamber 201 after forming a deposition layer on the substrate S using the deposition source 210, or the deposition material that is not involved in the deposition process after being ejected from the deposition source 210, but exists in the chamber 201, may affect next deposition processes, thereby degrading characteristics of the deposition layers. Further, when such the deposition material is introduced in the pump 220 via the exhaust hole 201b, performance of the pump 220 may be degraded, and thus, the deposition environment characteristic in the chamber 201 may be degraded and the pump 220 may be damaged.

In the present embodiment, the cooling plates 231 are located in the chamber 201 so as to capture the deposition material remaining in the chamber 201, and thus, cleanliness in the chamber 201 may be maintained and characteristics of the pump 220 may be maintained, thereby improving characteristics of the deposition layers.

The exhaust hole 201b coupled to the pump 220 and the deposition source 210 are located on different surfaces of the chamber 201, for example, the exhaust hole 201b may be formed in the side surface of the chamber 201 and the deposition source 210 may be located on the lower surface of the chamber 201, so that affects to the deposition source 210 and the substrate S during exhausting and pressure controlling operations through the exhaust hole 201b may be reduced.

In addition, the cooling plates 231 are located on opposite sides of the exhaust hole 201b to be adjacent to the exhaust hole 201b to improve the deposition material capturing property of the cooling plates 231. In one embodiment, the cooling plates 231 are formed on the side surface of the chamber 201 to be adjacent to the exhaust hole 201b so as not to affect the deposition source 210 and the substrate S located on the lower surface of the chamber 201 when capturing the remaining deposition material.

Figure 8:
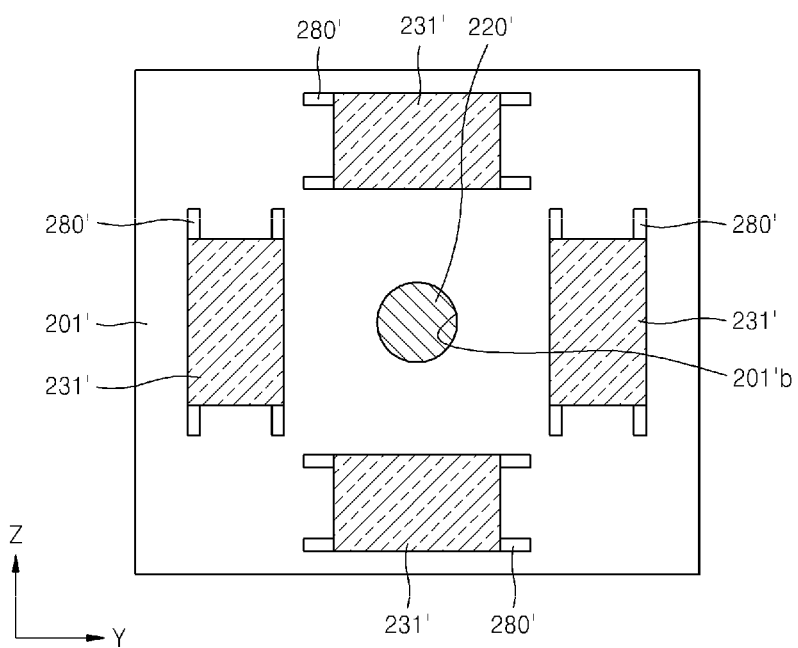

FIGS. 8 and 9 are diagrams showing modified examples of the deposition apparatus 200 of FIG. 6, according to some embodiments of the present invention. For example, according to the embodiments of the present invention, the cooling plates 231 may be located at opposite sides of the exhaust hole 201b as shown in FIG. 7, and moreover, four cooling plates 231' may be positioned to surround an exhaust hole (e.g., an exhaust opening) 201b' as shown in FIG. 8. By forming the four cooling plates 231' surrounding the exhaust hole 201b', introduction of the deposition material into the exhaust hole 201b' may be prevented, and the cooling plates 231' may more easily capture the deposition material.

Further, as shown in FIG. 9, an integrated (e.g., one-piece) cooling plate 231" may be formed to surround an exhaust hole (e.g., an exhaust opening) 201b".

Although not shown in the drawings, the modified examples shown in FIGS. 8 and 9 may be applied to the previous embodiments.

FIG. 10 is a schematic diagram of a deposition apparatus 300, according to another example embodiment of the present invention.

Referring to FIG. 10, the deposition apparatus 300 includes a chamber 301, a deposition source 310, a pump 320, cooling plates 331, refrigerators 341, and a compressor 350.

The chamber 301 is formed to properly maintain an environment of a deposition space in which deposition processes are performed. The chamber 301 includes one or more entries for carrying in and carrying out a substrate S. Additionally, the chamber 301 includes an exhaust hole (e.g., an exhaust opening) 301b at a side surface thereof so as to control a pressure during the deposition processes. Further, the chamber 301 includes a through hole that corresponds to the refrigerators 341 that will be described later.

The substrate S that is a deposition target on which the deposition processes will be performed is located on an upper portion of the deposition source 310. The substrate S is located on a side surface of the chamber 301. Although not shown in FIG. 10, the chamber 301 may be fixed on a stage that is located on the side surface of the chamber 301.

The deposition source 310 is located in the chamber 301. The deposition source 310 faces the substrate S. The deposition source 310 may be capable of moving in one or more directions, and for example, may reciprocate between opposite directions M1 and M2 as shown in FIG. 10.

The deposition source 310 may include a nozzle for supplying a deposition material toward the substrate S. In addition, the deposition source 310 may include a hardening portion for hardening a deposition layer after the deposition layer is formed on the substrate S by selectively using the deposition material.

An evaporation unit 312 may be coupled to the deposition source 310 via a connection member 315. A liquid phase material supply apparatus may be coupled to the evaporation unit 312 to supply the deposition material of a liquid phase to the evaporation unit 312, and the evaporation unit 312 vaporizes the deposition material and supplies the deposition material to the deposition source 310.

The pump 320 is located out of the chamber 301. The pump 320 is coupled to the exhaust hole 301b of the chamber 301 to control pressure environment of the deposition process and cleanliness of the chamber 301. The exhaust hole 301b is located at a side surface of the chamber 301. For example, the exhaust hole 301b is located in a surface of the chamber 301, which faces the surface on which the substrate S is located.

Two cooling plates 331 are located around the exhaust hole 301b in the chamber 301. In one embodiment, the two cooling plates 331 correspond to (e.g., are mounted at) a side surface of the chamber 301, and may be positioned at opposite sides of the exhaust hole 301b.

Two refrigerators 341 are coupled respectively to the cooling plates 331. In an embodiment, the refrigerators 341 are directly coupled to the cooling plates 331 without using a connection member such as a hose or a pipe. For example, an area (e.g., predetermined area) of a lower surface of each cooling plate 331 contacts the refrigerator 341.

A cooling material such as helium is contained in the refrigerators 341, and members for freezing, such as a heat exchanger, a condenser, and other components may be included in each of the refrigerators 341.

The refrigerators 341 may be coupled to the compressor 350, and the cooling material (for example, helium) is transferred to the compressor 350 via a discharge pipe 355a to be processed, and then, may be transferred to the refrigerators 341 again via an introduction pipe 355b.

Each of the cooling plates 331 may be formed as a rectangle (e.g., have a rectangular shape) extending in a direction.

Each of the refrigerators 341 extends from an outside of the chamber 301 into the chamber 301. For example, the refrigerator 341 passes through the chamber 301 via a through hole of the chamber 301 so that an end of the refrigerator 341 contacts the lower surface (e.g., the surface facing the wall of the chamber 301) of the cooling plate 331 that is located in the chamber 301. Although not shown in FIG. 10, a gasket may be located between the refrigerator 341 and the cooling plate 331.

Support rods are located between each of the cooling plates 331 and the chamber 301. As such, the cooling plates 331 are separated from the chamber 301. A heating member is located to correspond to the lower surface of the cooling plate 331.

Configurations of the cooling plates 331, the refrigerators 341, the support rods 380, the heating member, and the gasket are similar to those of the previous embodiment, and thus, detailed descriptions thereof are not provided here.

Operations and effects of the deposition apparatus 300, according to the present embodiment, will be described. The deposition apparatus 300 includes a deposition source 310 for forming a deposition layer on the substrate S. In one embodiment, the deposition source 310 may supply the deposition material containing an organic monomer to the substrate S in a gas state (or gas phase).

The deposition material in gas phase reaches the substrate S to form a desired deposition layer. Here, the substrate S is located on the side surface of the chamber 301, and the deposition source 310 is formed to face the substrate S and move in the chamber 301, so that the deposition process may be performed while moving the deposition source 310 relative to the substrate S. In addition, the exhaust hole 301b may be formed in the side surface of the chamber 301 to control the movement of the deposition source 210 without being affected by the exhaust hole 301b and the cooling plates 331.

The deposition material remaining in the chamber 301 after forming a deposition layer on the substrate S using the deposition source 310, or the deposition material that is not involved in the deposition process after being ejected from the deposition source 310, but exists in the chamber 301, may affect next deposition processes, thereby degrading characteristics of the deposition layers. Further, when such the deposition material is introduced in the pump 320 via the exhaust hole 301b, performance of the pump 320 may be degraded, and thus, the deposition environment characteristic in the chamber 301 may be degraded and the chamber 301 may be damaged.

In the present embodiment, the cooling plates 331 are located in the chamber 301 so as to capture the deposition material remaining in the chamber 301, and thus, cleanliness in the chamber 301 may be maintained and characteristics of the pump 320 may be maintained, thereby improving characteristics of the deposition layers.

In addition, the cooling plates 331 are located on opposite sides of the exhaust hole 301b to be adjacent to the exhaust hole 301b to improve the deposition material capturing property of the cooling plates 331. In one embodiment, the cooling plates 331 are formed on the side surface of the chamber 301 to be adjacent to the exhaust hole 301b so as not to affect the deposition source 310 and the substrate S when capturing the remaining deposition material.

Further, the exhaust hole 301b coupled to the pump 320 and the substrate S are located on different surfaces of the chamber 301, such as surfaces facing each other, so as to reduce (e.g., minimize) adverse effects that the exhaustion and a pressure control operation through the exhaust hole 301b may have on the deposition source 310 and the substrate S.

Structures shown in FIGS. 8 and 9 may also be applied to the deposition apparatus 300 of FIG. 10, according to the present embodiment.

Figure 11:
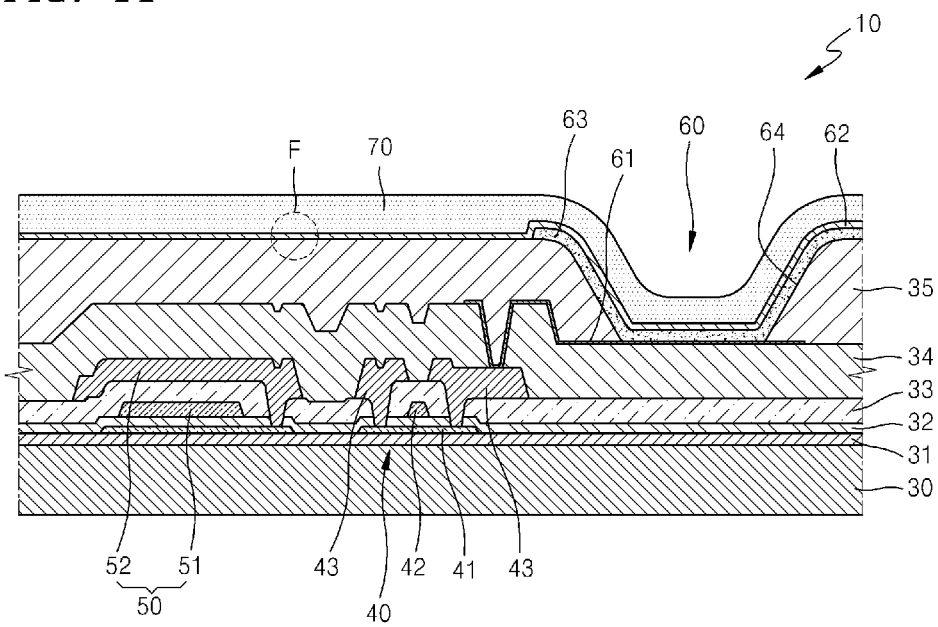
FIG. 11 is a schematic cross-sectional view of an organic light emitting display apparatus manufactured using a deposition apparatus, according to an example embodiment of the present invention.
Figure 12:
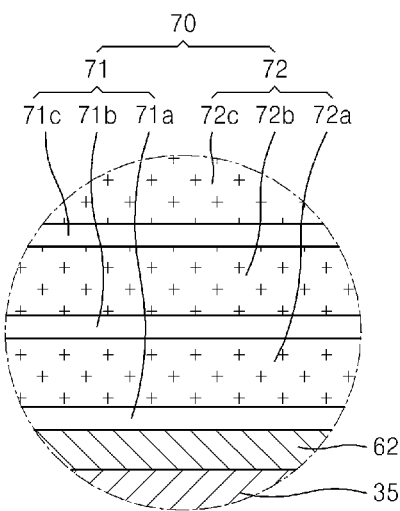
FIG. 12 is an enlarged view of a portion F in FIG. 11, according to an example embodiment of the present invention.

FIG. 11 is a schematic cross-sectional view of an organic light emitting display apparatus 10 manufactured using a deposition apparatus, according to the embodiment of the present invention, and FIG. 12 is an enlarged view of a portion F shown in FIG. 11, according to some embodiments of the present invention.

Referring to FIGS. 11 and 12, the organic light emitting display apparatus 10 is formed on a substrate 30. The substrate 30 may be formed of a glass material, a plastic material, and/or a metal material.

A buffer layer 31 providing a flat surface on the substrate 30 and including an insulating material for preventing moisture and impurities from infiltrating into the substrate 30 is formed on the substrate 30.

A thin film transistor (TFT) 40, a capacitor 50, and an organic light emitting device 60 are formed on the buffer layer 31. The TFT 40 includes an active layer 41, a gate electrode 42, and source/drain electrodes 43. The organic light emitting device 60 includes a first electrode 61, a second electrode 62, and an intermediate layer 63. The capacitor 50 includes a first capacitor electrode 51 and a second capacitor electrode 52.

In one embodiment, the active layer 41 having a pattern (e.g., a predetermined pattern) is located on the buffer layer 31. The active layer 41 may include an inorganic semiconductor material such as silicon, an organic semiconductor material, and/or an oxide semiconductor material, and may be formed by injecting p-type or n-type dopant selectively.

A gate insulating layer 32 is formed on the active layer 41. A gate electrode 42 is formed on the gate insulating layer 32 to correspond to the active layer 41. The first capacitor electrode 51 may be formed on the gate insulating layer 32, and may be formed of a material that is the same as that forming the gate electrode 42.

An interlayer dielectric 33 is formed to cover the gate electrode 42, and the source/drain electrodes 43 are formed on the interlayer dielectric 33 to contact regions (e.g., predetermined regions) of the active layer 41. The second capacitor electrode 52 may be formed on the interlayer dielectric 33 and may be formed of the same material as that of the source/drain electrodes 43.

A passivation layer 34 is formed to cover the source/drain electrodes 43, and an additional insulating layer may be further formed on the passivation layer 34 for planarizing the TFT 40.

The first electrode 61 is formed on the passivation layer 34. The first electrode 61 is electrically coupled to one of the source/drain electrodes 43. In addition, a pixel defining layer 35 is formed to cover the first electrode 61. An opening (e.g., a predetermined opening) 64 is formed in the pixel defining layer 35, and the intermediate layer 63 including an organic emission layer is formed in a region defined by the opening 64. The second electrode 62 is formed on the intermediate layer 63.

An encapsulation layer 70 is formed on the second electrode 62. The encapsulation layer 70 may include an organic material or an inorganic material, or may have a structure in which the organic material and the inorganic material are alternately stacked.

In some embodiments, the encapsulation layer 70 may be formed using the deposition apparatus 100, 200, or 300. For example, the substrate 30 on which the second electrode 62 is formed is carried into the chamber 101, 201, or 301, and after that, a desired layer may be formed using the deposition apparatus 100, 200, or 300, or a modified example thereof.

In one embodiment, the encapsulation layer 70 includes an inorganic layer 71 and an organic layer 72, and the inorganic layer 71 includes a plurality of sub-layers 71a, 71b, and 71c and the organic layer 72 includes a plurality of sub-layers 72a, 72b, and 72c. Here, the layers 72a, 72b, and 72c in the organic layer 72 may be formed using the deposition apparatus 100, 200, or 300.

However, the embodiments of the present invention are not limited thereto, and other organic layers in the organic light emitting display apparatus 10 may be formed.

As described above, when using the deposition apparatus 100, 200, or 300, according to the embodiments of the present invention, characteristics of the deposition layers formed in the organic light emitting display apparatus 10 may be improved. Thus, electrical property and image quality, of the organic light emitting display apparatus 10 may be improved.

Further, the deposition apparatus 100, 200, or 300, according to the embodiments of the present invention, may form thin films in a liquid crystal display apparatus or in other various suitable display apparatuses, in addition to the organic light emitting display apparatus 10.

According to the deposition apparatus and through the method of forming a thin film, and the method of manufacturing the organic light emitting display apparatus of the present invention, the deposition processes may be performed effectively, and characteristics of deposition layers may be improved.

While the present invention has been particularly shown and described with reference to example embodiments thereof, it will be understood by those of ordinary skill in the art that various suitable changes in form and details may be made therein without departing from the spirit and scope of the present invention as defined by the following claims, and equivalents thereof.

What is claimed is:

1. A method of forming a thin film by performing a deposition process on a substrate using a deposition apparatus, the method comprising:
   carrying the substrate into a chamber;
   ejecting one or more deposition materials toward the substrate using a deposition source in the chamber; and
   capturing the deposition materials remaining in the chamber using a cooling plate coupled to a refrigerator and corresponding to an inner surface of the chamber, at which an exhaust opening is formed,
   wherein the cooling plate and the exhaust opening are formed in a same surface of the chamber and wherein the cooling plate is disposed around the exhaust opening in the chamber.

2. The method of claim 1, wherein the deposition process is performed while moving the substrate or the deposition source.

3. The method of claim 1, wherein a cooling material in the refrigerator is processed using a compressor.

4. A method of manufacturing an organic light emitting display apparatus using a deposition apparatus, the method comprising forming at least one thin film in the organic light emitting display apparatus, wherein the forming of the at least one thin film comprises:
   carrying a substrate into a chamber;
   ejecting one or more deposition materials toward the substrate using a deposition source in the chamber; and
   capturing the deposition materials remaining in the chamber using a cooling plate coupled to a refrigerator and corresponding to an inner surface of the chamber, at which an exhaust opening is formed,
   wherein the cooling plate and the exhaust opening are formed in a same surface of the chamber and wherein the cooling plate is disposed around the exhaust opening in the chamber.

5. The method of claim 4, wherein the organic light emitting display apparatus comprises a first electrode, an intermediate layer comprising an organic emission layer, a second electrode, and an encapsulation layer on the substrate, the encapsulation layer comprising at least one thin film.

6. The method of claim 5, wherein the encapsulation layer comprises an organic layer and an inorganic layer the organic layer comprising the at least one thin film.

* * * * *